United States Patent
Han et al.

(10) Patent No.: US 10,431,624 B2
(45) Date of Patent: Oct. 1, 2019

(54) METHOD OF MANUFACTURING IMAGE SENSOR INCLUDING NANOSTRUCTURE COLOR FILTER

(71) Applicants: SAMSUNG ELECTRONICS CO., LTD., Suwon-si (KR); CALIFORNIA INSTITUTE OF TECHNOLOGY, Pasadena, CA (US)

(72) Inventors: Seunghoon Han, Seoul (KR); Yongsung Kim, Suwon-si (KR); Seyedeh Mahsa Kamali, Pasadena, CA (US); Amir Arbabi, Pasadena, CA (US); Yu Horie, Pasadena, CA (US); Andrei Faraon, Pasadena, CA (US); Sungwoo Hwang, Seoul (KR)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/193,229

(22) Filed: Jun. 27, 2016

(65) Prior Publication Data

US 2017/0012078 A1 Jan. 12, 2017

Related U.S. Application Data

(60) Provisional application No. 62/189,964, filed on Jul. 8, 2015.

(30) Foreign Application Priority Data

Nov. 20, 2015 (KR) .................. 10-2015-0163342

(51) Int. Cl.
*H01L 27/14* (2006.01)
*H01L 27/12* (2006.01)
(Continued)

(52) U.S. Cl.
CPC .... *H01L 27/14685* (2013.01); *H01L 27/1203* (2013.01); *H01L 27/14621* (2013.01);
(Continued)

(58) Field of Classification Search
CPC ......... H01L 27/14; H01L 27/12; H01L 21/76; H01L 27/14685; H01L 27/1203; H01L 21/76256
(Continued)

(56) References Cited

U.S. PATENT DOCUMENTS 7,745,247 B2 * 6/2010 Koizumi ........... H01L 27/14627
438/48
8,148,762 B2 4/2012 Joe et al.
(Continued)

FOREIGN PATENT DOCUMENTS

KR 10-1445844 B1 10/2014
KR 10-2016-0064922 A 6/2016
WO 2012/082734 A1 6/2012

*Primary Examiner* — Sheikh Maruf
(74) *Attorney, Agent, or Firm* — Sughrue Mion, PLLC

(57) ABSTRACT

A method of manufacturing an image sensor includes: preparing a sensor substrate including: a sensor layer including a photosensitive cell; and a signal line layer including lines to receive electric signals from the photosensitive cell; forming a first material layer having a first refractive index on the sensor substrate; and forming a nanopattern layer on the first material layer, the nanopattern layer including a material having a second refractive index different from the first refractive index.

22 Claims, 17 Drawing Sheets

(51) Int. Cl.
*H01L 21/76* (2006.01)
*H01L 27/146* (2006.01)
*H01L 21/762* (2006.01)

(52) U.S. Cl.
CPC .. *H01L 27/14698* (2013.01); *H01L 21/76254* (2013.01); *H01L 21/76256* (2013.01)

(58) Field of Classification Search
USPC .......................................................... 438/70
See application file for complete search history.

(56) References Cited

U.S. PATENT DOCUMENTS

| | | | |
|---|---|---|---|
| 8,330,840 B2 | 12/2012 | Lenchenkov | |
| 2007/0153377 A1* | 7/2007 | Goto | G02B 5/045 359/460 |
| 2007/0262364 A1* | 11/2007 | Hsu | H01L 27/14621 257/291 |
| 2008/0157247 A1* | 7/2008 | Yun | H01L 27/14621 257/432 |
| 2008/0185521 A1* | 8/2008 | Hollingsworth | B82Y 20/00 250/338.1 |
| 2008/0283821 A1* | 11/2008 | Park | H01L 21/02381 257/13 |
| 2009/0065820 A1* | 3/2009 | Kao | H01L 27/14632 257/292 |
| 2009/0251771 A1* | 10/2009 | Hendriks | B82Y 20/00 359/342 |
| 2010/0134429 A1* | 6/2010 | You | G06F 3/044 345/173 |
| 2010/0194709 A1* | 8/2010 | Tamaki | G02F 1/13338 345/174 |
| 2010/0265384 A1* | 10/2010 | Tay | H01L 27/14621 348/336 |
| 2010/0308455 A1* | 12/2010 | Kim | H01L 21/187 257/734 |
| 2011/0024880 A1* | 2/2011 | Li | H01L 21/02439 257/618 |
| 2011/0051142 A1* | 3/2011 | Yanagisawa | G01N 21/554 356/445 |
| 2011/0063717 A1* | 3/2011 | Consonni | G01Q 60/22 359/298 |
| 2011/0080589 A1* | 4/2011 | Gan | B82Y 20/00 356/477 |
| 2011/0201201 A1* | 8/2011 | Arnold | B82Y 30/00 438/694 |
| 2011/0298072 A1* | 12/2011 | Chuang | H01L 27/1462 257/432 |
| 2012/0138342 A1* | 6/2012 | Muramoto | G06F 3/0412 174/254 |
| 2012/0198935 A1* | 8/2012 | Samson | G02B 5/1809 73/514.26 |
| 2012/0241198 A1* | 9/2012 | Kajiya | G06F 3/0412 174/250 |
| 2012/0273752 A1* | 11/2012 | Lee | H01L 33/007 257/13 |
| 2013/0162547 A1* | 6/2013 | Yoo | G06F 3/041 345/173 |
| 2013/0201116 A1* | 8/2013 | Huang | G06F 3/044 345/173 |
| 2013/0258570 A1* | 10/2013 | Nashiki | G06F 3/044 361/679.01 |
| 2013/0328575 A1* | 12/2013 | Ra | G06F 3/041 324/649 |
| 2014/0218738 A1* | 8/2014 | Bartoli | G01N 21/45 356/450 |
| 2015/0084144 A1* | 3/2015 | Suzuki | H01L 27/1463 257/432 |
| 2015/0085168 A1* | 3/2015 | Watanabe | H01L 31/18 348/273 |
| 2015/0130005 A1* | 5/2015 | Ko | H01L 27/14627 257/432 |
| 2015/0171125 A1* | 6/2015 | Jangjian | H01L 27/14627 257/432 |
| 2015/0187831 A1* | 7/2015 | Osamura | H01L 27/14645 257/432 |
| 2015/0194460 A1* | 7/2015 | Maekawa | H01L 27/14685 438/70 |
| 2015/0214262 A1* | 7/2015 | Kim | H01L 27/14627 257/432 |
| 2015/0270298 A1* | 9/2015 | Lin | H01L 27/14627 257/432 |
| 2016/0013229 A1* | 1/2016 | Tu | H01L 27/14621 257/432 |
| 2016/0054173 A1* | 2/2016 | Kim | H01L 27/14685 250/208.1 |
| 2016/0056193 A1* | 2/2016 | Wu | H01L 27/14621 257/292 |
| 2016/0073065 A1* | 3/2016 | Lee | H01L 27/14627 348/273 |
| 2016/0087113 A1* | 3/2016 | Goldan | G01T 1/24 250/370.12 |
| 2016/0099274 A1* | 4/2016 | Vora | H01L 27/1203 257/432 |
| 2016/0181307 A1* | 6/2016 | Vora | H01L 27/1203 250/366 |
| 2017/0010710 A1* | 1/2017 | Kim | G06F 3/044 |

* cited by examiner

METHOD OF MANUFACTURING IMAGE SENSOR INCLUDING NANOSTRUCTURE COLOR FILTER

CROSS-REFERENCE TO RELATED APPLICATIONS

This application claims priority from U.S. Provisional Application No. 62/189,964, filed on Jul. 8, 2015, in the U.S. Patent Office and Korean Patent Application No. 10-2015-0163342, filed on Nov. 20, 2015, in the Korean Intellectual Property Office, the disclosures of which are incorporated herein in their entireties by reference.

GOVERNMENT SUPPORT STATEMENT

This invention was made with government support under Grant No. DE-SC0001293 awarded by the DOE, and under Grant No. W911NF-14-1-0345 awarded by the U.S. Army. The government has certain rights in the invention.

BACKGROUND

1. Field

Methods consistent with exemplary embodiments relate to a method of manufacturing a high-resolution image sensor.

2. Description of the Related Art

The number of pixels of image sensors has been increased, and thus the formation of smaller pixels has been required. It is difficult to reduce the size of pixels while guaranteeing a necessary amount of light and elimination of noise. Recently, cell-separation type back illuminated structure (BIS) sensors have been introduced and significantly developed.

However, the structure of optical components such as color filters or microlenses collecting color light in a direction toward optical sensors is a factor limiting the formation of small pixels. For example, microlenses are disposed on absorption-type color filters to guide light toward the color filters. In this structure, the thicknesses of microlenses and the color filters limit the formation of small pixels.

SUMMARY

One or exemplary embodiments provide methods of manufacturing an image sensor including a nanostructure color filter configured to decrease the size of pixels.

Additional aspects will be set forth in part in the description which follows and, in part, will be apparent from the description, or may be learned by practice of the presented embodiments.

According to an aspect of an exemplary embodiment, a method of manufacturing an image sensor includes: preparing a sensor substrate including a sensor layer and a signal line layer, the sensor layer including at least one photosensitive cell, the signal line layer including lines to read electric signals from the photosensitive cell; forming a first material layer having a first refractive index on the sensor substrate; and forming a nanopattern layer on the first material layer, the nanopattern layer including a plurality of nanostructures including a material having a second refractive index greater than the first refractive index.

The forming of the nanopattern layer may include: bonding a first substrate having the second refractive index to the first material layer; forming a second material layer having a predetermined thickness by reducing a thickness of the first substrate; and patterning the second material layer.

The patterning of the second material layer may be performed to form a plurality of regions in which at least one of a shape and a pitch of the nanostructures repeatedly arranged is different.

The first material layer may include a silicon oxide layer, and the first substrate may include a silicon substrate.

The bonding of the first substrate may be performed by an anodic bonding method.

The thickness of the first substrate may be reduced by a chemical mechanical polishing (CMP) method.

Prior to the bonding of the first substrate, the method may further include forming a weak region in the first substrate by implanting ions into the first substrate.

The thickness of the first substrate may be reduced by a layer splitting method.

The first substrate may include a silicon-on-insulator (SOI) substrate, and the SOI substrate may include first and second silicon layers and a silicon oxide layer between the first and second silicon layers.

The thickness of the first substrate may be reduced by removing the second silicon layer and the silicon oxide layer.

The forming of the nanopattern layer may be performed by forming the nanostructures on a second substrate and transferring the nanostructures to the first material layer.

The method may further include forming a plurality of nanoribbons by underetching a surface of the second substrate which is in contact with the nanostructures.

The nanostructures may be transferred to the first material layer using a viscoelastic polymer.

According to an aspect of another exemplary embodiment, a method of manufacturing an image sensor includes: preparing an SOI substrate including first and second silicon layers and a silicon oxide layer between the first and second silicon layers, and processing the second silicon layer to form a sensor layer including at least one photosensitive cell; forming lines on the sensor layer to read electric signals from the photosensitive cell, and a protective layer on the sensor layer to protect the lines; bonding a first substrate to the protective layer; reducing a thickness of the first silicon layer; and forming a nanopattern layer including a plurality of nanostructures by patterning the first silicon layer.

The forming of the nanopattern layer may be performed by patterning the first silicon layer to form a plurality of regions in which at least one of a shape and a pitch of the nanostructures repeatedly arranged is different.

The protective layer may include a silicon oxide.

The first substrate may include a silicon substrate.

The bonding of the first substrate to the protective layer may be performed by an anodic bonding method.

The bonding of the first substrate to the protective layer may be performed by a polymer bonding method using a polymer layer between the first substrate and the protective layer.

The protective layer may include a polymer, and the bonding of the first substrate to the protective layer may be performed by a polymer bonding method.

The bonding of the first substrate to the protective layer may be performed by a metal bonding method using a metal layer between the first substrate and the protective layer.

According to an aspect of another exemplary embodiment, a method of manufacturing an image sensor includes: preparing a sensor substrate including: a sensor layer including a photosensitive cell; and a signal line layer including lines to receive electric signals from the photosensitive cell;

forming a first material layer having a first refractive index on the sensor substrate; and forming a nanopattern layer on the first material layer, the nanopattern layer including a material having a second refractive index different from the first refractive index.

The forming the nanopattern layer may include: bonding a first substrate having the second refractive index to the first material layer; forming a second material layer having a predetermined thickness by reducing a thickness of the first substrate; and patterning the second material layer to form a plurality of nanostructures on the first material layer.

The patterning the second material layer may include forming a plurality of regions in which at least one of a shape of the plurality of nanostructures and a pitch of adjacent nanostructures of the plurality of nanostructures is adjusted.

The first material layer may include a silicon oxide layer, and the first substrate may include a silicon substrate.

The bonding the first substrate may be performed by an anodic bonding method.

The reducing the thickness of the first substrate may include reducing the thickness of the first substrate by a chemical mechanical polishing (CMP) method.

The method may further include forming a region in the first substrate by implanting ions into the first substrate prior to the bonding the first substrate.

The thickness of the first substrate may be reduced by a layer splitting method.

The first substrate may include a silicon-on-insulator (SOI) substrate, and the SOI substrate may include a first silicon layer, a second silicon layer and a silicon oxide layer provided between the first and the second silicon layers.

The reducing the thickness of the first substrate may include removing the second silicon layer and the silicon oxide layer.

The forming the nanopattern layer may include: forming a plurality of nanostructures on a second substrate; and transferring the plurality of nanostructures on the second substrate to the first material layer.

The method may further include forming a plurality of nanoribbons by underetching a surface of the second substrate, the underetched surface being in contact with the plurality of nanostructures.

The plurality of nanostructures may be transferred to the first material layer using a viscoelastic polymer.

The second refractive index may be greater than the first refractive index.

According to an aspect of another exemplary embodiment, a method of manufacturing an image sensor may include: preparing an SOI substrate including a first silicon layer, second silicon layer and a silicon oxide layer provided between the first and the second silicon layers; forming a sensor layer including at least one photosensitive cell by processing the second silicon layer; forming lines on the sensor layer to receive electric signals from the at least one photosensitive cell; forming a protective layer on the sensor layer to cover the lines; bonding a first substrate to the protective layer; reducing a thickness of the first silicon layer; and patterning the first silicon layer to form a nanopattern layer including a plurality of nano structures.

The patterning the first silicon layer may include forming a plurality of regions in which at least one of a shape of the plurality of nanostructures and a pitch of adjacent nanostructures of the plurality of nanostructures repeatedly arranged is adjusted.

The protective layer may include a silicon oxide.

The first substrate may include a silicon substrate.

The bonding the first substrate to the protective layer may be performed by an anodic bonding method.

The bonding the first substrate to the protective layer may be performed by a polymer bonding method using a polymer layer provided between the first substrate and the protective layer.

The protective layer may include a polymer, and the bonding the first substrate to the protective layer may be performed by a polymer bonding method.

The bonding the first substrate to the protective layer may be performed by a metal bonding method using a metal layer provided between the first substrate and the protective layer.

According to an aspect of another exemplary embodiment, a method of manufacturing an image sensor includes: providing a sensor substrate; forming a first layer having a first refractive index on the sensor substrate and having a thickness smaller than a wavelength band of visible light; and forming a second layer including a plurality of nanostructures on the first layer, the plurality of nanostructures including a material having a second refractive index different from the first refractive index.

The sensor substrate may include: a sensor layer including at least one photosensitive cell; and a signal line layer comprising lines to receive electric signals from the photosensitive cell.

BRIEF DESCRIPTION OF THE DRAWINGS

The above and/or other aspects of the disclosure will become apparent and more readily appreciated from the following description of the embodiments, taken in conjunction with the accompanying drawings in which.

DETAILED DESCRIPTION

Figure 1:
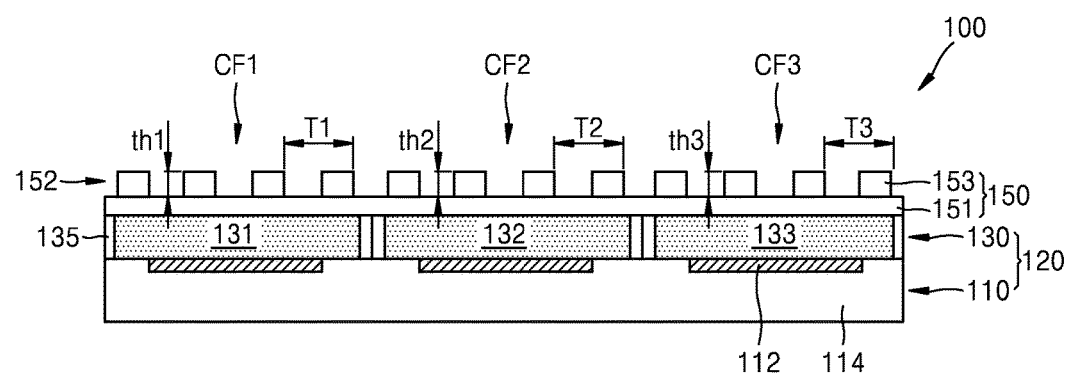
FIG. 1 is a cross-sectional view schematically illustrating an image sensor according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, the exemplary embodiments will be described in detail with reference to the accompanying drawings. In the drawings, like reference numerals denote like elements, and overlapping descriptions thereof will be omitted.

In the following descriptions of the exemplary embodiments, although the terms "first" and "second" are used to describe various elements, these elements should not be limited by these terms. These terms are only used to distinguish one element from another element.

In the following descriptions of the embodiments, the terms of a singular form may include plural forms unless referred to the contrary.

In the following descriptions of the embodiments, the meaning of "include," "comprise," "including," or "comprising" specifies a property, a region, a fixed number, a step, a process, an element, a component, and a combination thereof but does not exclude other properties, regions, fixed numbers, steps, processes, elements, components, and combinations thereof.

It will be understood that when a film, a region, or an element is referred to as being "above" or "on" another film, region, or element, it can be directly on the other film, region, or element, or intervening films, regions, or elements may also be present.

In the drawings, the sizes of elements may be exaggerated for clarity. For example, in the drawings, the size or thickness of each element may be arbitrarily shown for illustrative purposes, and thus the inventive concept should not be construed as being limited thereto.

Figure 2:
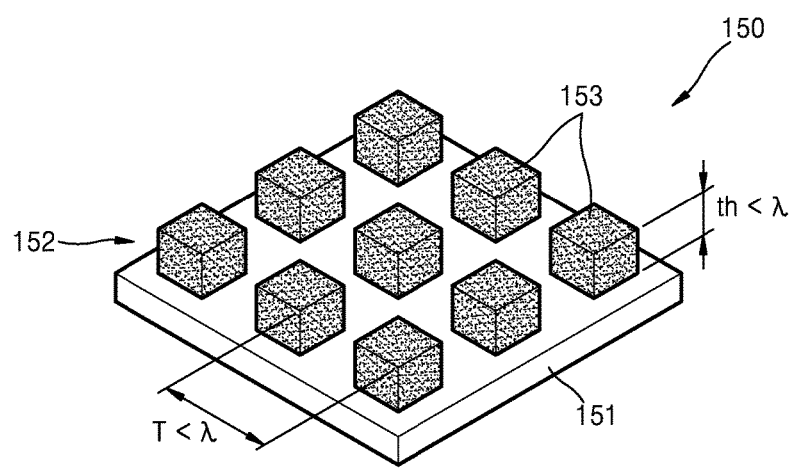
FIG. 2 is a perspective view illustrating a nanostructure color filter of the image sensor depicted in FIG. 1.

FIG. 1 is a cross-sectional view schematically illustrating an image sensor 100 to be manufactured by a manufacturing method according to an exemplary embodiment. FIG. 2 is a perspective view illustrating a nanostructure color filter 150 of the image sensor 100 depicted in FIG. 1.

The image sensor 100 includes a sensor layer 130 generating electric signals in response to light, and the nanostructure color filter 150 arranged on the sensor layer 130. The sensor layer 130 may include at least one photosensitive cell. For example, the sensor layer 130 may include photosensitive cells 131, 132, and 133.

In the exemplary embodiment, because the image sensor 100 includes the nanostructure color filter 150, the image sensor 100 may have a high resolution and reduced thickness. The nanostructure color filter 150 includes a nanostructure pattern in which at least two materials having different refractive indexes are repeatedly arranged at a predetermined pitch, and a plurality of color filter regions are defined by adjusting structures such as the shape or pitch of the nanostructure pattern.

The nanostructure color filter 150 includes: a first material layer 151 including a material having a first refractive index; and a plurality of nanostructures 153 arranged on the first material layer 151 and including a material having a second refractive index greater than the first refractive index.

The material of the nanostructures 153 having a relatively high refractive index may include one of single crystal silicon (Si), poly Si, amorphous Si, $Si_3N_4$, GaP, $TiO_2$, AlSb, AlAs, AlGaAs, AlGaInP, BP, and $ZnGeP_2$.

The first material layer 151 may function as a support structure for forming the nanostructures 153. The first material layer 151 may include a material having a refractive index lower than the refractive index of the nanostructures 153. For example, the first material layer 151 may include one of $SiO_2$ and polymers such as polycarbonate (PC), polystyrene (PS), and polymethylmethacrylate (PMMA).

A nanopattern layer 152 formed by the nanostructures 153 includes a plurality of color filter regions CF1, CF2, and CF3. The color filter regions CF1, CF2, and CF3 are arranged to respectively face the photosensitive cells 131, 132, and 133. The color filter regions CF1, CF2, and CF3 may respectively transmit first-color light, second-color light, and third-color light, and may reflect or absorb light having the other colors. For example, the first, second, and third colors may be red, green, and blue, respectively. In FIG. 1, three color filter regions CF1, CF2, and CF3 are illustrated. However, this is an example. That is, the color filter regions CF1, CF2, and CF3 may be repeatedly arranged according to a required number of pixels. In this case, color filter regions may be repeatedly arranged in such a manner that every four pixels may be formed by two green filter regions, one blue filter region, and one red filter region. Alternatively, cyan, yellow, green, and magenta color filter regions may be repeatedly arranged. Alternatively, color filter regions may be repeatedly arranged in such a manner that every four pixels may be formed by two white filter regions, one blue filter region, and one red filter region.

As shown in FIG. 2, the nanostructure color filter 150 includes the nanostructures 153 repeatedly arranged on the first material layer 151 with a pitch T. The nanostructures 153 are illustrated as having a parallelepiped block shape. However, the nanostructures 153 are not limited thereto. The nanostructures 153 may have another shape such as a polyhedral column shape or a circular column shape. In addition, the nanostructures 153 are illustrated as being two-dimensionally aligned with each other in rows and columns. However, the nanostructures 153 may be staggered in rows or columns.

Regions between the nanostructures 153 may be empty space, for example, filled with air. Thus, the nanostructures 153 and a material having a low refractive index, that is, air, may be alternately arranged. The regions between the nanostructures 153 may be filed with a material having a refractive index lower than the refractive index of the nanostructures 153.

The nanostructure color filter 150 transmits light having a certain wavelength and reflects light having the other wavelengths, and the transmission wavelength of the nanostructure color filter 150 is determined according to factors such as the refractive index difference between the relatively high refractive index material forming the nanostructures 153 and the relatively low refractive index material filled between the nanostructures 153, or the pitch T, the shape, or the thickness th of the nanostructures 153. The pitch T of the nanostructures 153 may be smaller than a wavelength $\lambda$. For example, the pitch T of the nanostructures 153 may be equal to or smaller than about ¾ or half of the wavelength $\lambda$. The thickness th of the nanostructures 153 may be smaller than the wavelength $\lambda$. For example, the thickness th of the nanostructures 153 may equal to or smaller than about half of the wavelength $\lambda$. In the above, the wavelength $\lambda$, refers to a center wavelength of a wavelength band desired to be transmitted.

The color filter regions CF1, CF2, and CF3 may transmit light having different wavelengths and may reflect or absorb light having the other wavelengths. To this end, at least one of factors such as the pitch, material, shape, and thickness of each of the color filter regions CF1, CF2, and CF3 may be different from those of the others. The nanostructures 153 may have the same material and shape in the color filter regions CF1, CF2, and CF3 but different pitches and thicknesses in the color filter regions CF1, CF2, and CF3, so as to adjust the transmission wavelength bands of the color filter regions CF1, CF2, and CF3. For example, the color filter region CF1 may have a pitch T1 and a thickness t1, the color filter region CF2 may have a pitch T2 and a thickness t2, and the color filter region CF3 may have a pitch T3 and a thickness t3.

In each of the color filter regions CF1, CF2, and CF3, the nanostructures 153 may be shaped and arranged to collect light. In addition, the nanostructures 153 may be shaped and arranged to form a structure suitable for the angle of incident of light. In this case, even in the same color filter region, the nanostructures 153 may be differently designed according to the relative positions thereof in the image sensor 100.

The photosensitive cells 131, 132, and 133 of the sensor layer 130 may be operated independent of one another, and each of the photosensitive cells 131, 132, and 133 may generate an electric signal in proportion to the intensity of light incident thereon. For example, the photosensitive cells 131, 132, and 133 may include photodiodes, complementary metal-oxide semiconductor (CMOS) sensors, or charge-coupled device (CCD) sensors. Barriers 135 may be provided between the photosensitive cells 131, 132, and 133. Due to the barriers 135, an inclined light beam passing through one of the color filter regions CF1, CF2, and CF3 and incident on a corresponding one of the photosensitive cells 131, 132, and 133 may be prevented from striking neighboring photosensitive cells. To this end, the barriers 135 may include a material absorbing or reflecting light. The barriers 135 may include a material having a refractive index lower than the refractive index of a material of the photosensitive cells 131, 132, and 133.

The image sensor 100 includes a signal line layer 110 to receive electric signals from the sensor layer 130. The signal line layer 110 may include a plurality of metal lines 112 and a protective layer (not shown) protecting the metal lines 112.

The nanostructure color filter 150 is arranged on an upper surface of the sensor layer 130, that is, a surface opposite the surface of the sensor layer 130 on which the signal line layer 110 is arranged. This structure in which light passing through the nanostructure color filter 150 is directly incident on the sensor layer 130 is called a back side illumination (BSI) structure. Unlike the BSI structure, a structure in which the signal line layer 110 is located above the sensor layer 130 such that light may be incident on the sensor layer 130 through the signal line layer 110, is called a front side illumination (FSI) structure. In the BSI structure, light is incident on the sensor layer 130 without interference with the signal line layer 110. That is, light may be incident on the sensor layer 130 more efficiently in the BSI structure than in the FSI structure.

Various methods of manufacturing the image sensor 100 or an image sensor configured to perform substantially the same function as the image sensor 100 will now be described according to exemplary embodiments.

FIGS. 3A to 3E are views illustrating a method of manufacturing an image sensor 101 according to an exemplary embodiment.

Figure 3A:
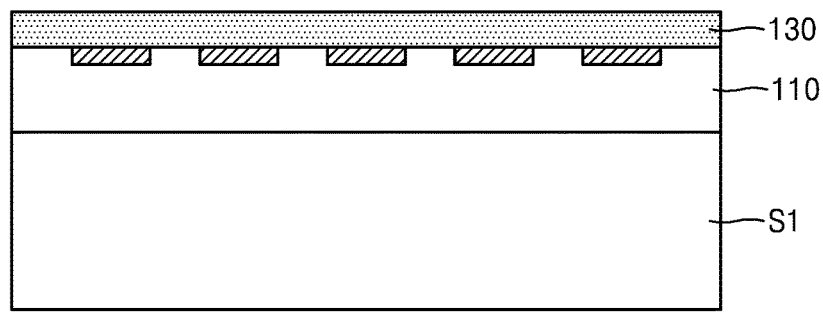
FIGS. 3A to 3E are views illustrating a method of manufacturing an image sensor according to an exemplary embodiment.

Referring to FIG. 3A, a sensor substrate 120 is prepared. The sensor substrate 120 includes a sensor layer 130 and a signal line layer 110 in which lines are arranged to receive electric signals from the sensor layer 130.

The sensor layer 130 may include a semiconductor material and a structure such as a diode structure capable of generating electric signals by detecting light. Although not shown in FIG. 3A, the sensor layer 130 may include a plurality of photosensitive cells and barriers between the photosensitive cells as shown in FIG. 1.

The sensor substrate 120 including the signal line layer 110 and the sensor layer 130 may be supported by a substrate S1. The substrate S1 may function as a handling substrate when additional structures are formed on an opposite surface of the sensor substrate 120, that is, an upper surface of the sensor layer 130 of the sensor substrate 120. The substrate S1 may be omitted.

Figure 3B:
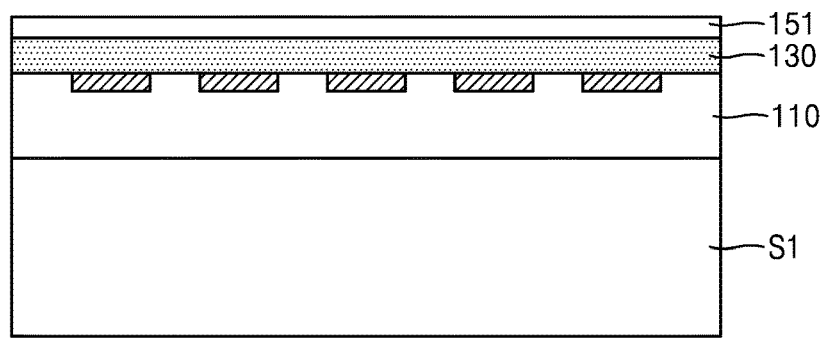

Referring to FIG. 3B, a first material layer 151 having a first refractive index is formed. The first material layer 151 may have a thickness smaller than the wavelength band of visible light. For example, the first material layer 151 may have a thickness of about 50 nm to about 200 nm. The first material layer 151 may include $SiO_2$ or a polymer such as hydrogen silsesquioxane (HSQ) or SU8. The first material layer 151 may be formed by a method such as a deposition method or a spin coating method depending on the material of the first material layer 151.

Figure 3C:
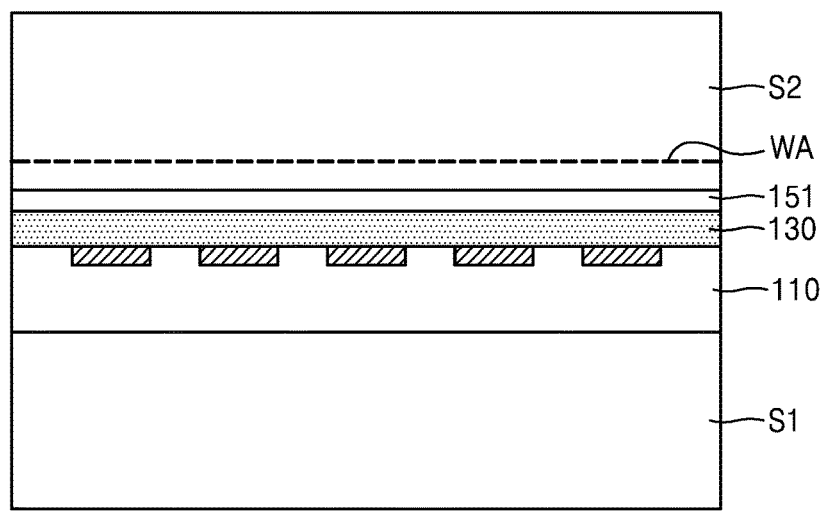

Referring to FIG. 3C, a substrate S2 is disposed on the first material layer 151. The substrate S2 may be bonded to the first material layer 151.

The substrate S2 includes a material having a refractive index greater than that of the first material layer 151, and the above-described nanostructures may be formed using the substrate S2. The substrate S2 may be a silicon substrate including single crystal silicon.

Before the substrate S2 is bonded to the first material layer 151, a weak region WA may be previously formed in the substrate S2. For example, the weak region WA may be formed by an ion implantation method. For example, if a large number of H+ ions are implanted into the substrate S2 in a region having a certain depth, the region may become weaker than the other region of the substrate S2 because of the H+ ions. The weak region WA may be used when the thickness of the substrate S2 is reduced by a layer splitting method in a later process.

The substrate S2 may be bonded to the first material layer 151 by an anodic bonding method. The anodic bonding method is also called a field-assisted sealing method and may be used for bonding glass and silicon wafers. For example, if the substrate S2 is a silicon substrate and the first material layer 151 includes $SiO_2$, the anodic bonding method may be used. An anodic bonding process will now be briefly described. A voltage of several hundreds of volts (V) is applied between the substrate S2 and the first material layer 151 such that the substrate S2 may have a positive charge, and then the substrate S2 and the first material layer 151 are heated to a temperature of several hundreds of degrees Celsius (° C.). As a result of the heating, the mobility of positive ions of the first material layer 151 may increase, and thus positive ions may move toward a surface acting as a cathode and may disappear. However, negative ions more firmly confined in the first material layer 151 may form a space charge layer near an interface with the substrate S2, and as positive ions move in a direction away from the interface, a potential drop at the interface between the substrate S2 and the first material layer 151 may increase. As a result, the substrate S2 and the first material layer 151 may be bonded together at the interface by an electric field.

Alternatively, the substrate S2 may be bonded to the first material layer 151 by a polymer bonding method. In the polymer bonding method, the first material layer 151 may include a polymer functioning as a bonding material. After the substrate S2 is placed on the first material layer 151, if the substrate S2 and the first material layer 151 are heated and cooled, or pressed, the substrate S2 and the first material layer 151 may be bonded together.

Figure 3D:
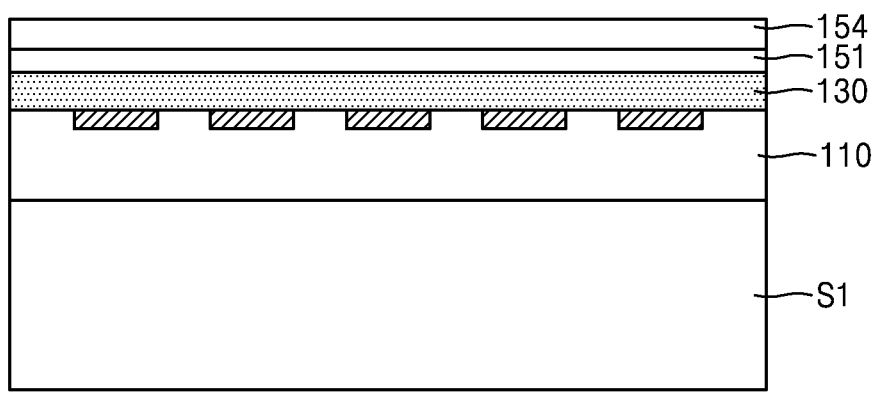

Referring to FIG. 3D, a second material layer 154 having a second refractive index is formed. The second material layer 154 is a layer having an intended thickness and formed by removing most of the substrate S2. The second material layer 154 may be formed by a chemical mechanical polishing (CMP) method, and an additional etching process may be performed to finely adjust the thickness of the second material layer 154.

Alternatively, as described with reference to FIG. 3C, a weak region WA may be previously formed in the substrate S2 by ion implantation, and the second material layer 154 may be formed by a layer splitting method using the weak region WA. For example, after bonding another substrate to the substrate S2 including the weak region WA, the another substrate may be detached to split the substrate S2 from the weak region WA along the dotted line shown in FIG. 3C. In the exemplary embodiment, an additional etching process may also be performed to finely adjust the thickness of the second material layer 154.

Figure 3E:
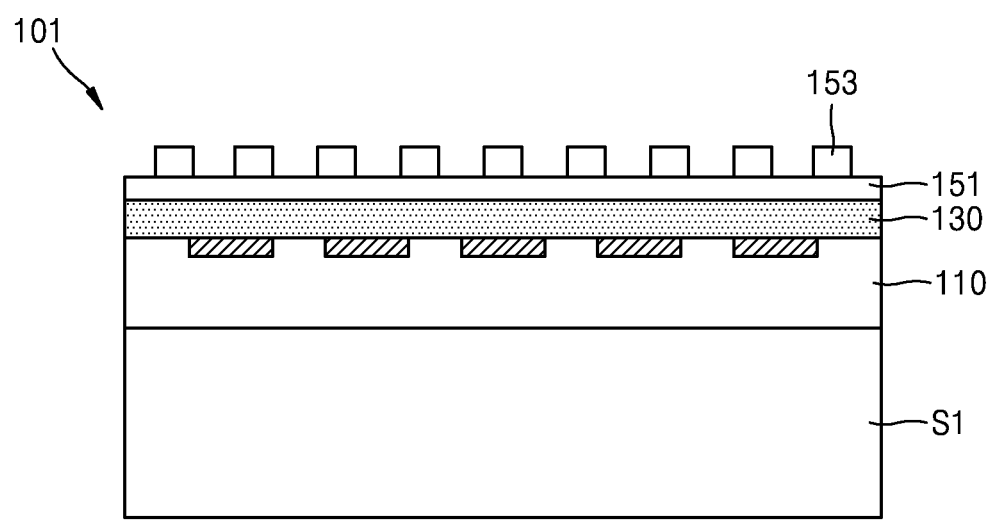

Next, the second material layer 154 is patterned to form a nanopattern layer 152 including a plurality of nanostructures 153 as shown in FIG. 3E. The nanopattern layer 152 may be formed through a photolithography process, and a mask for forming nanostructures having a pitch varying according to regions may be used in the photolithography process. In this manner, an image sensor 101 including a nanostructure color filter 150 is manufactured.

According to the above-described manufacturing method, because a previously manufactured silicon substrate including a single crystal silicon layer is used, nanostructures 153 may easily be formed using the single crystal silicon layer, and thus an image sensor including a nanostructure color filter having high wavelength selectivity may be manufactured.

FIGS. 4A to 4E are views illustrating a method of manufacturing an image sensor 102 according to an exemplary embodiment.

The manufacturing method of the exemplary embodiment is different from the manufacturing method illustrated with reference to FIGS. 3A to 3E, in that a silicon-on-insulator (SOI) substrate is used to form nanostructures 153 of a nanostructure color filter 150.

Figure 4A:
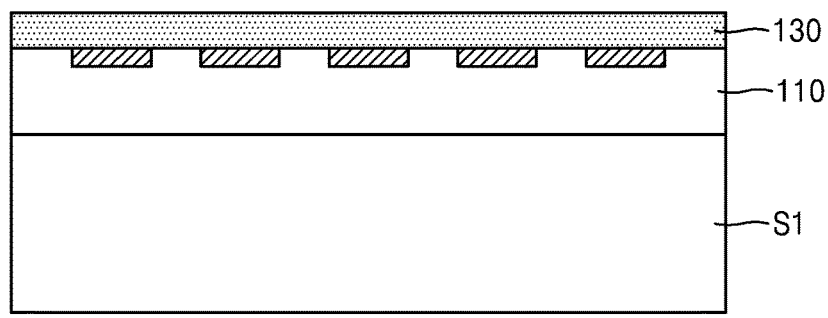
FIGS. 4A to 4E are views illustrating a method of manufacturing an image sensor according to an exemplary embodiment.
Figure 4B:
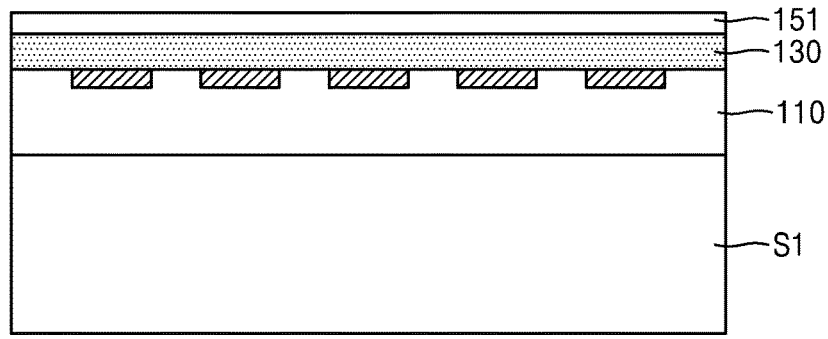

Referring to FIGS. 4A and 4B, a sensor substrate 120 is prepared. The sensor substrate 120 includes a sensor layer 130 and a signal line layer 110 in which lines are arranged to read/receive electric signals from the signal line layer 110. Then, a first material layer 151 having a first refractive index is formed on the sensor layer 130.

Figure 4C:
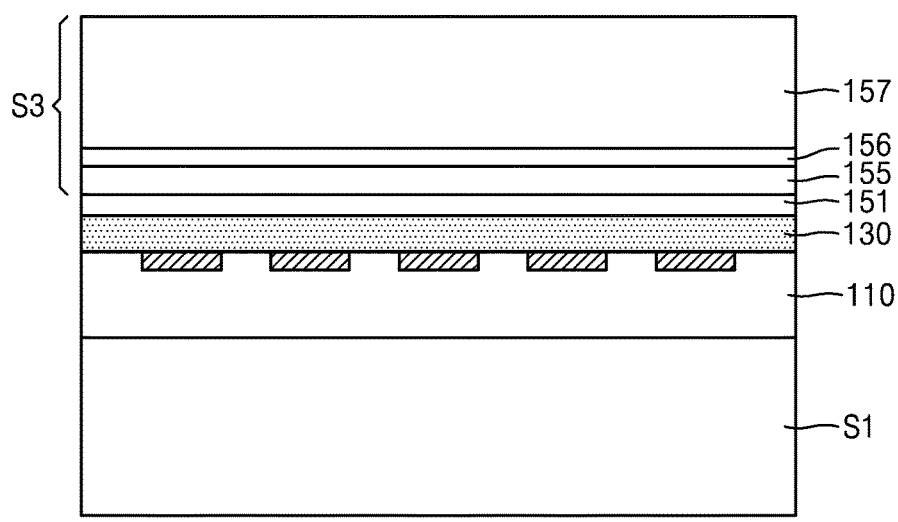

Referring to FIG. 4C, a substrate S3 is placed on the first material layer 151. The substrate S3 may be bonded to the first material layer 151.

The substrate S3 is an SOI substrate including a first silicon layer 155, a silicon oxide layer 156, and a second silicon layer 157. The first silicon layer 155 may include a single crystal silicon material and may have a refractive index greater than that of the first material layer 151 including SiO₂ or a polymer. The above-described nanostructures may be formed using the first silicon layer 155.

When the substrate S3 is bonded to the first material layer 151, the above-described anodic bonding method or the polymer bonding method may be used.

Figure 4D:
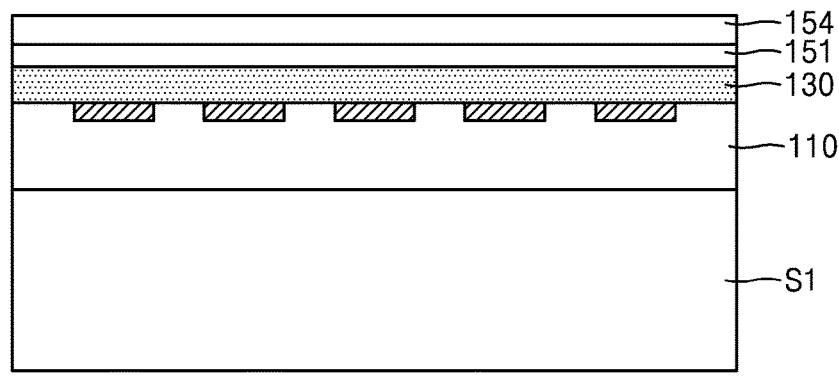

Referring to FIG. 4D, a second material layer 154 having a second refractive index is formed. The second material layer 154 is a layer having an intended thickness and formed by removing most of the substrate S3. For example, the silicon oxide layer 156 and the second silicon layer 157 of the substrate S3 may be removed by a CMP method, and the thickness of the remaining first silicon layer 155 may be finely adjusted through an additional etching process.

Figure 4E:
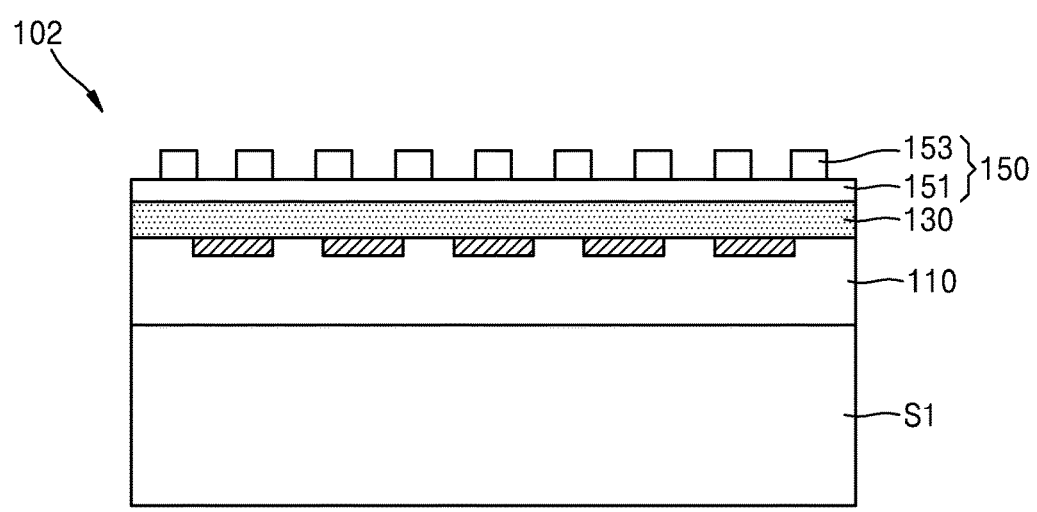

Next, the second material layer 154 is patterned to form a plurality of nanostructures 153 as shown in FIG. 4E. The nanostructures 153 may be formed through a photolithography process, and a mask for forming nanostructures having a pitch varying according to regions may be used in the photolithography process. In this manner, an image sensor 102 including a nanostructure color filter 150 is manufactured.

FIGS. 5A to 5H are views illustrating a method of manufacturing an image sensor 103 according to an exemplary embodiment.

The manufacturing method of the exemplary embodiment is different from the manufacturing methods of the previous exemplary embodiments in that a plurality of nanostructures are formed on a separate substrate and are then transferred to a sensor layer.

Figure 5A:
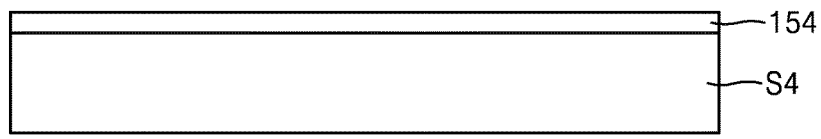
FIGS. 5A to 5H are views illustrating a method of manufacturing an image sensor according to an exemplary embodiment.

Referring to FIG. 5A, a second material layer 154 is formed on a substrate S4. The second material layer 154 may include a high refractive index material suitable for forming nanostructures of a nanostructure color filter.

The substrate S4 may be a silicon substrate, and the second material layer 154 may include single crystal silicon. Alternatively, the substrate S4 and the second material layer 154 may be an SOI substrate. That is, the second material layer 154 may be an upper silicon layer of an SOI substrate, and the substrate S4 may include a silicon oxide layer and a lower silicon layer of the SOI substrate.

Figure 5B:
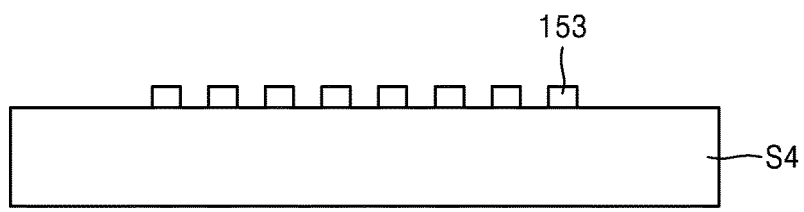

Referring to FIG. 5B, the second material layer 154 is patterned to form a plurality of nanostructures 153.

Figure 5C:
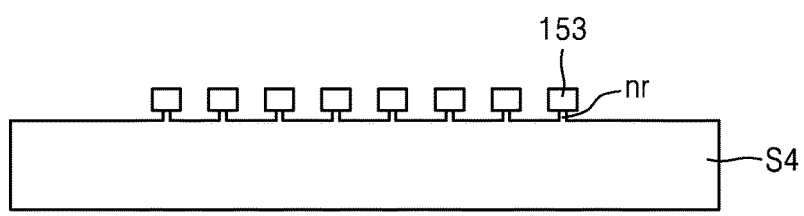

Referring to FIG. 5C, a surface of the substrate S4 which is in contact with the nanostructures 153 is underetched. This underetching may be performed using an etchant having different etching rates for a material of the nanostructures 153 and a material of the substrate S4. For example, if such an etchant is used, the substrate S4 may be etched more rapidly than the nanostructures 153. In this case, regions of the substrate S4 located under the nanostructures 153 may be isotropically etched, and thus underetched shapes may be formed.

As shown in FIG. 5C, because the nanostructures 153 are supported on the substrate S4 by nanoribbons nr, the nanostructures 153 may easily be separated from the substrate S4.

Figure 5D:
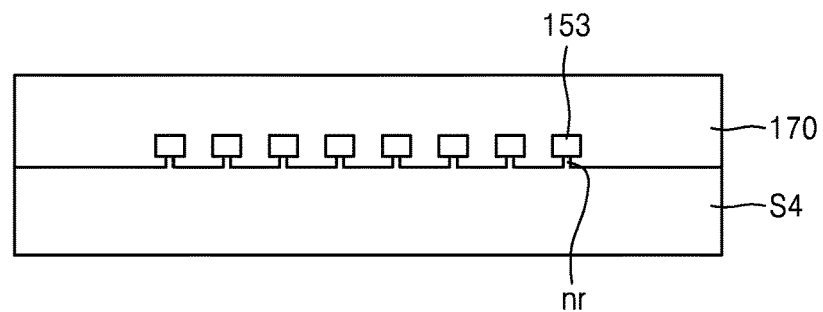

Referring to FIG. 5D, a viscoelastic material layer 170 is formed to cover the nanostructures 153. The viscoelastic material layer 170 may include a material having viscosity, elasticity, and releasing properties, and thus the nanostructures 153 may be easily separated from the substrate S4 using the viscoelastic material layer 170. For example, the viscoelastic material layer 170 may include a polymer. For example, the viscoelastic material layer 170 may include polydimethylsiloxane (PDMS).

Figure 5E:
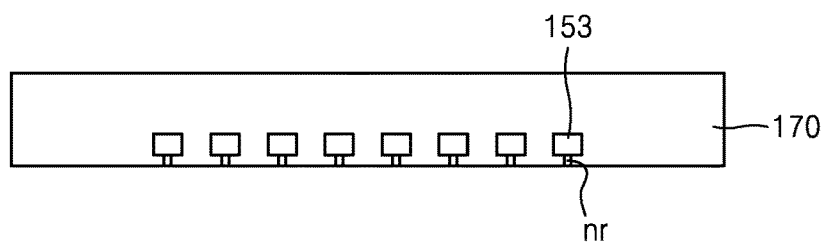

Referring to FIG. 5E, the viscoelastic material layer 170 is separated from the substrate S4. Because a supporting force exerted on the nanostructures 153 by the viscosity of the viscoelastic material layer 170 is stronger than a supporting force exerted on the nanoribbons nr by the substrate S4, the nanostructures 153 may easily be separated from the substrate S4.

Figure 5F:
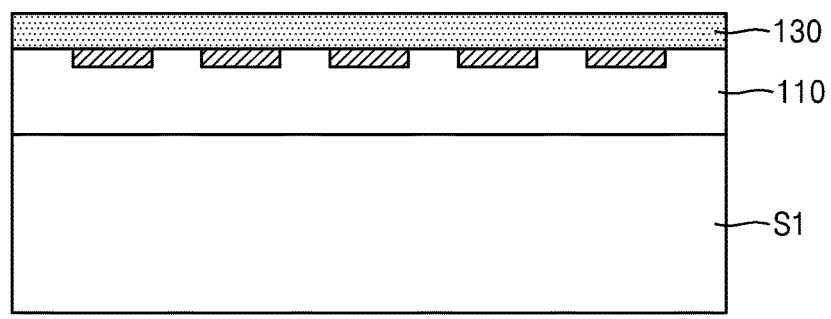
Figure 5G:
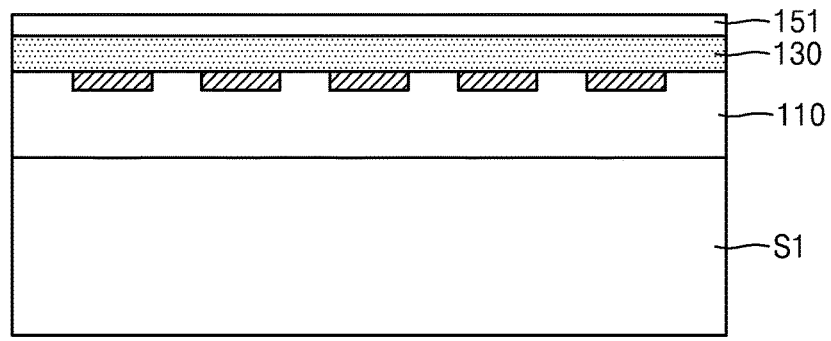

Referring to FIGS. 5F and 5G, a sensor substrate 120 is prepared. The sensor substrate 120 includes a sensor layer 130 and a signal line layer 110 in which lines are arranged to read electric signals from the signal line layer 110. Then, a first material layer 151 having a first refractive index is formed on the sensor layer 130. For example, the first material layer 151 may include $SiO_2$, HSQ, or SU8. The first material layer 151 may include the same material as that included in the viscoelastic material layer 170.

Figure 5H:
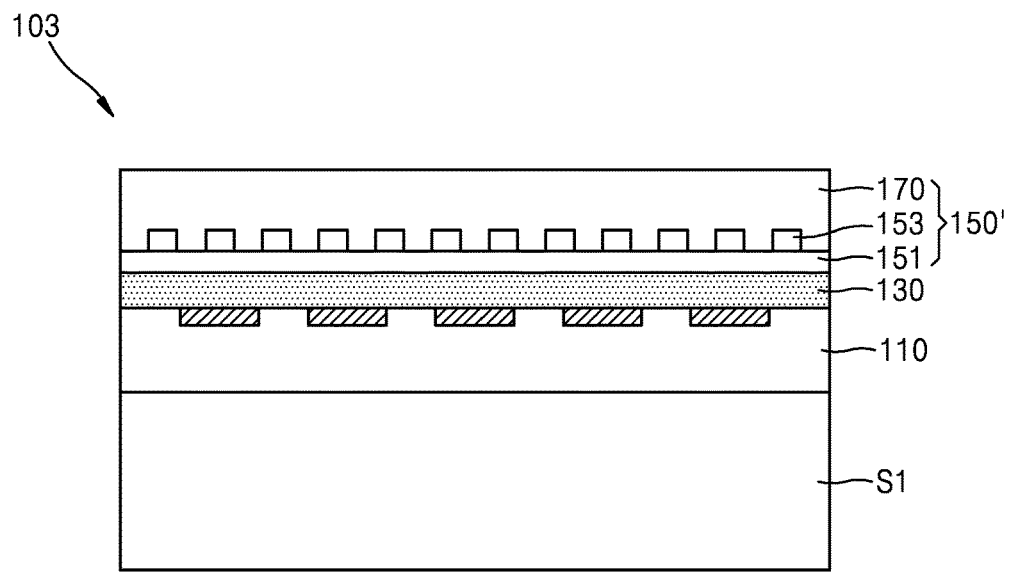

Referring to FIG. 5H, the viscoelastic material layer 170 in which the nanostructures 153 are buried is arranged on the first material layer 151. In this manner, an image sensor 103 including a nanostructure color filter 150' is manufactured.

FIGS. 6A to 6G are views illustrating a method of manufacturing an image sensor 104 according to an exemplary embodiment.

In the manufacturing method of the exemplary embodiment, a silicon layer of an SOI substrate is used to form a sensor layer, and a silicon oxide layer and another silicon layer of the SOI substrate are respectively used as a low refractive index material and a high refractive index material for forming a nanostructure color filter.

Figure 6A:
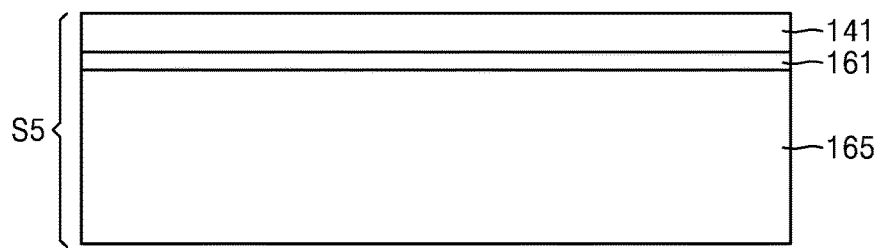
FIGS. 6A to 6G are views illustrating a method of manufacturing an image sensor according to an exemplary embodiment.

Referring to FIG. 6A, an SOI substrate S5 is prepared. The SOI substrate S5 includes a first silicon layer 165, a silicon oxide layer 161, and a second silicon layer 141. The first silicon layer 165 may be a single crystal silicon layer.

Figure 6B:
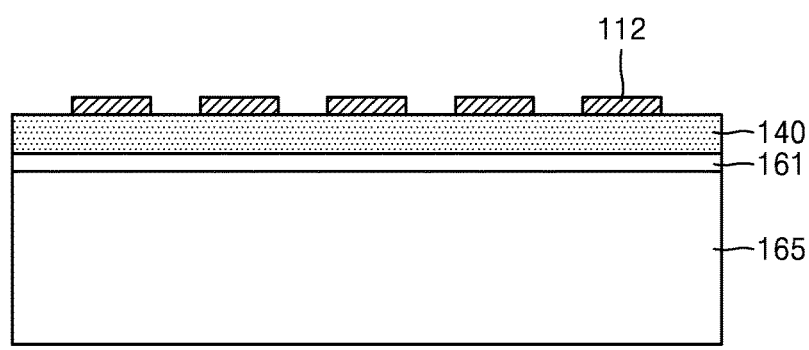

Referring to FIG. 6B, a sensor layer 140 is formed, and lines 112 are formed on the sensor layer 140. The sensor layer 140 is a layer including a plurality of photosensitive cells and formed by performing additional processes including a doping process and a barrier forming process on the second silicon layer 141 shown in FIG. 6A.

Figure 6C:
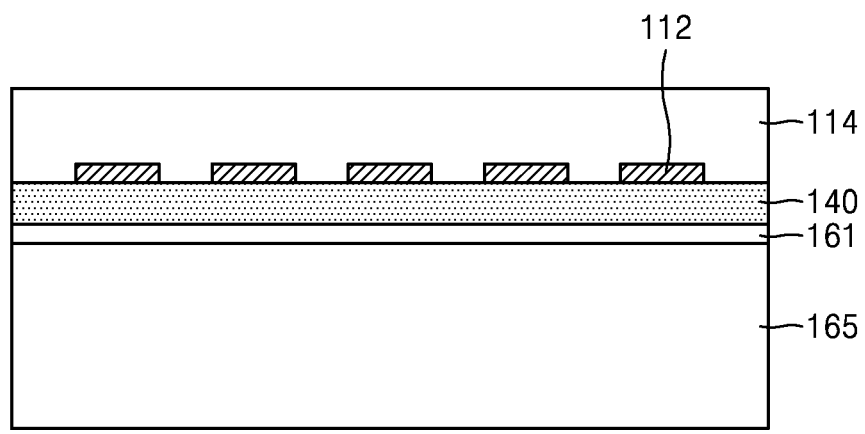

Referring to FIG. 6C, a protective layer 114 is further formed to protect the lines 112. The protective layer 114 may include $SiO_2$.

Figure 6D:
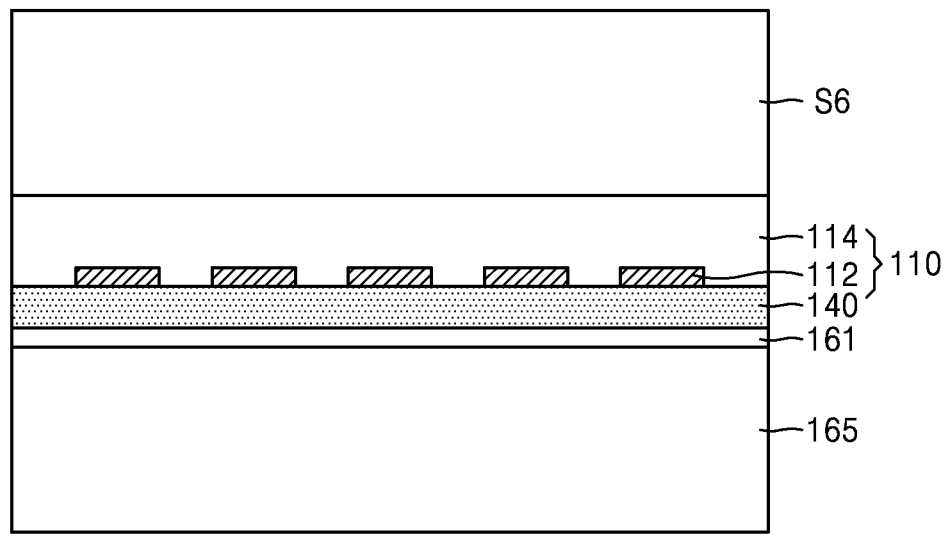

Referring to FIG. 6D, a substrate S6 is placed on the protective layer 114. The substrate S6 is used as a handling substrate when nanostructures are formed using the first silicon layer 165. The substrate S6 may be a silicon substrate and may be bonded to the protective layer 114 by an anodic bonding method.

Figure 6E:
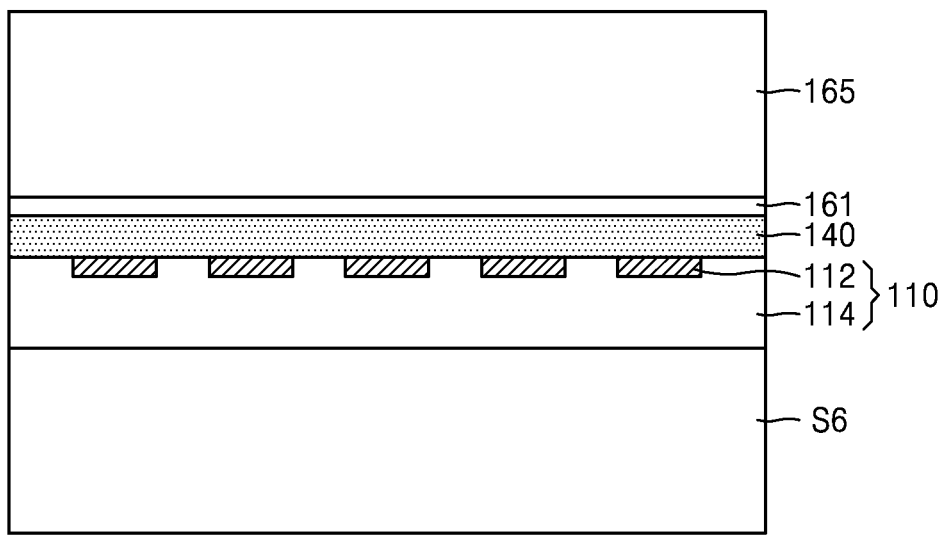
Figure 6F:
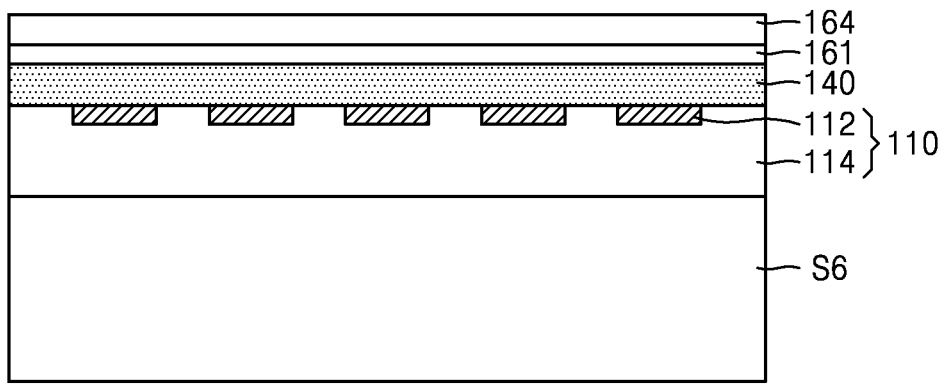

FIG. 6E illustrates a stack structure shown in FIG. 6D after turning the stack structure upside down. That is, the substrate S6 is located at a lowermost position, and the first silicon layer 165 is located an uppermost position. Referring to FIG. 6F, a second material layer 164 is formed by decreasing the thickness of the first silicon layer 165 to an intended thickness (i.e., a predetermined thickness). The second material layer 164 refers to a layer formed by decreasing the thickness of the first silicon layer 165 to a value suitable for forming nanostructures. This thickness adjustment may be carried out through a CMP process, and an additional etching process may be performed.

Figure 6G:
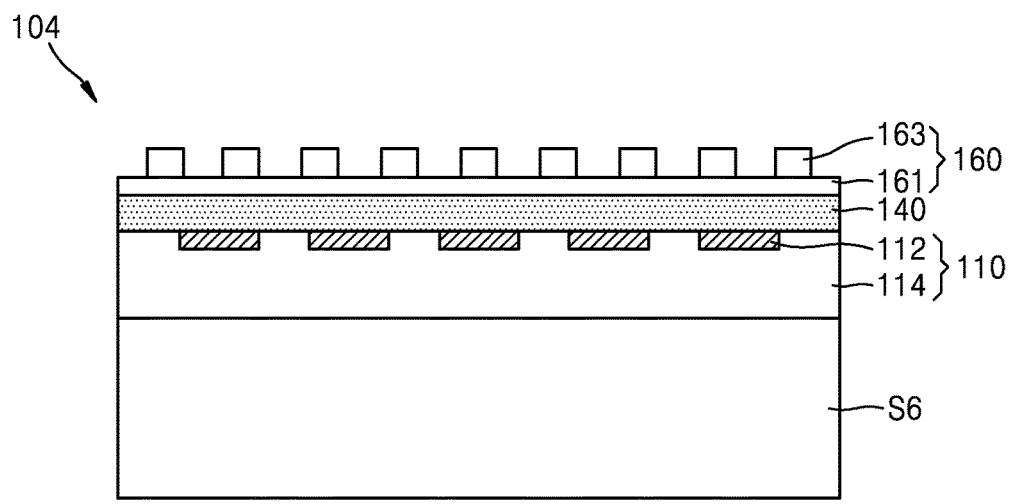

Next, the second material layer 164 is patterned to form a plurality of nanostructures 163 as shown in FIG. 6G. The nanostructures 163 may be formed through a photolithography process. In the photolithography process, a previously prepared mask may be used to form the nanostructures 163 in such a manner that the pitch of the nanostructures 163 varies according to regions. In this manner, an image sensor 104 including a nanostructure color filter 160 is manufactured.

FIGS. 7A to 7G are views illustrating a method of manufacturing an image sensor 105 according to an exemplary embodiment.

The manufacturing method of the exemplary embodiment is different from the manufacturing method illustrated in FIGS. 6A to 6G, in that a substrate S7 used as a handling substrate is bonded to a protective layer 114 by a different method from the method illustrated in FIGS. 6A to 6G.

Figure 7A:
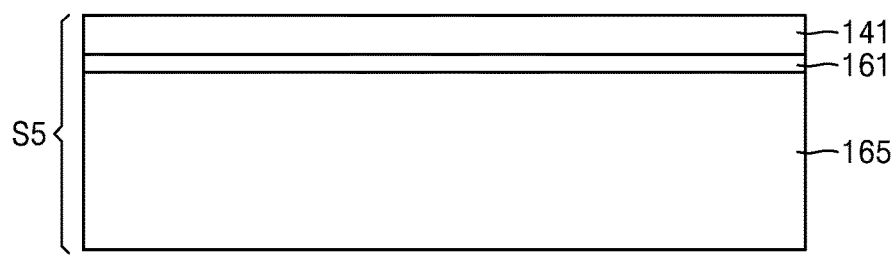
FIGS. 7A to 7G are views illustrating a method of manufacturing an image sensor according to an exemplary embodiment.
Figure 7B:
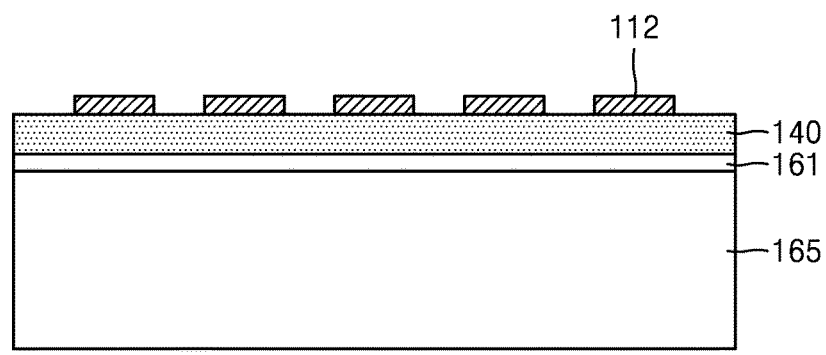
Figure 7C:
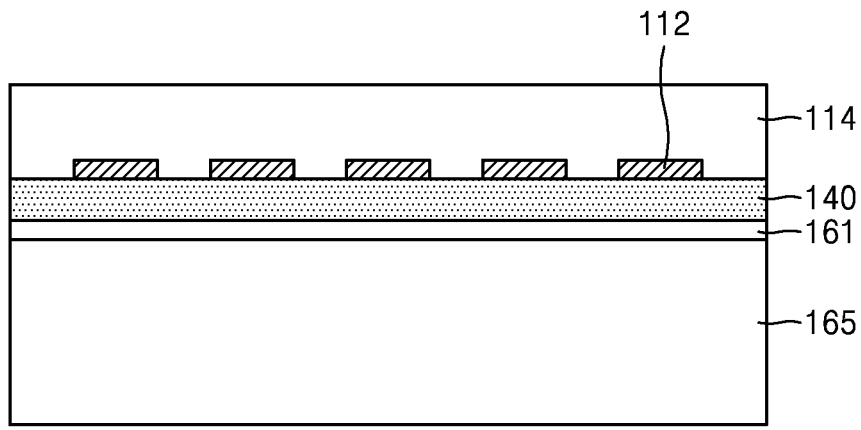
Figure 7D:
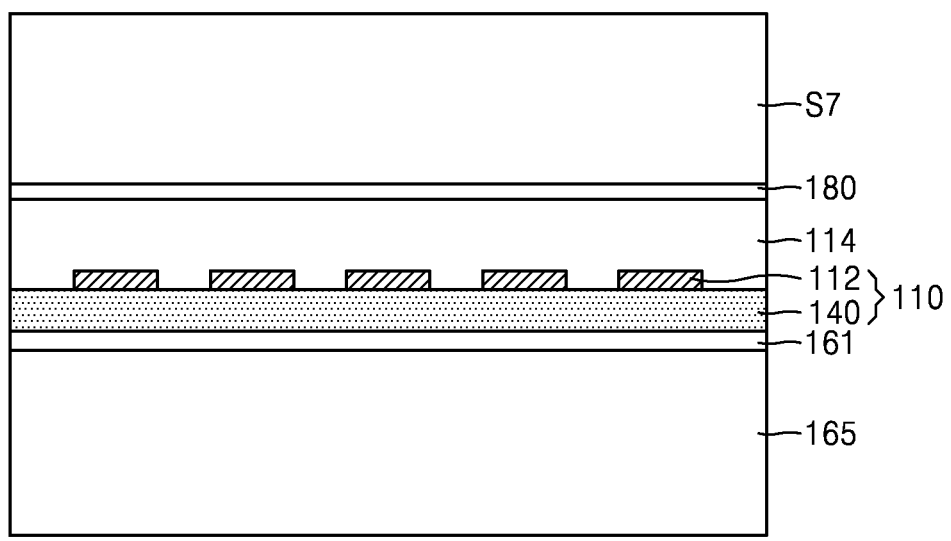

Processes illustrated in FIGS. 7A to 7C are substantially the same as those illustrated in FIGS. 6A to 6C. Referring to FIG. 7D, the substrate S7 is placed above the protective layer 114, and a polymer layer 180 is further formed on the protective layer 114 to bond the substrate S7 and the protective layer 114 together by a polymer bonding method using the polymer layer 180 as a bonding material. Alternatively, if the protective layer 114 includes a polymer, because the polymer may function as a bonding material, the substrate S7 and the protective layer 114 may be polymer-bonded to each other without the polymer layer 180.

Figure 7E:
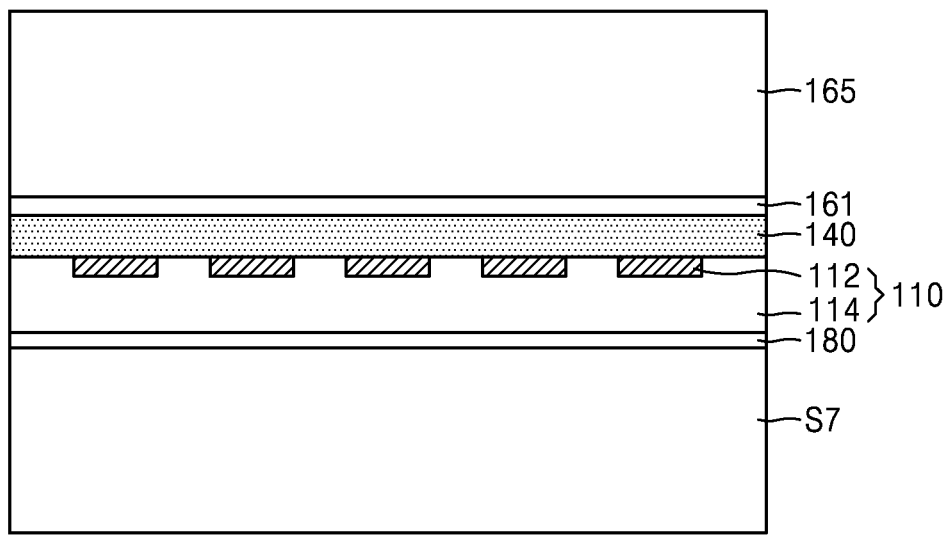
Figure 7F:
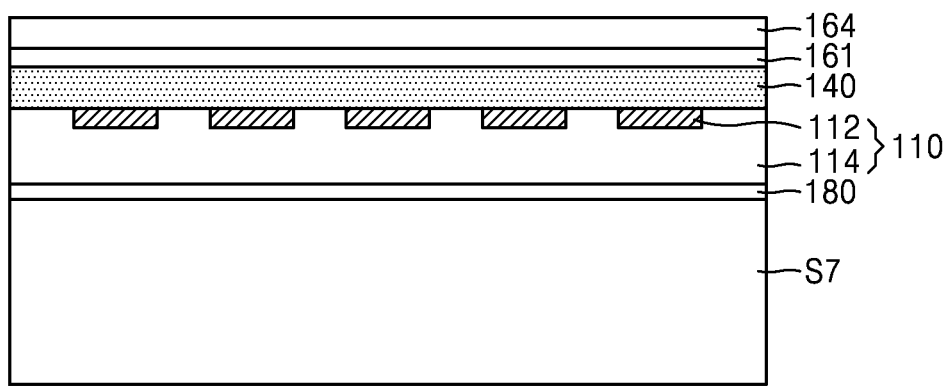
Figure 7G:
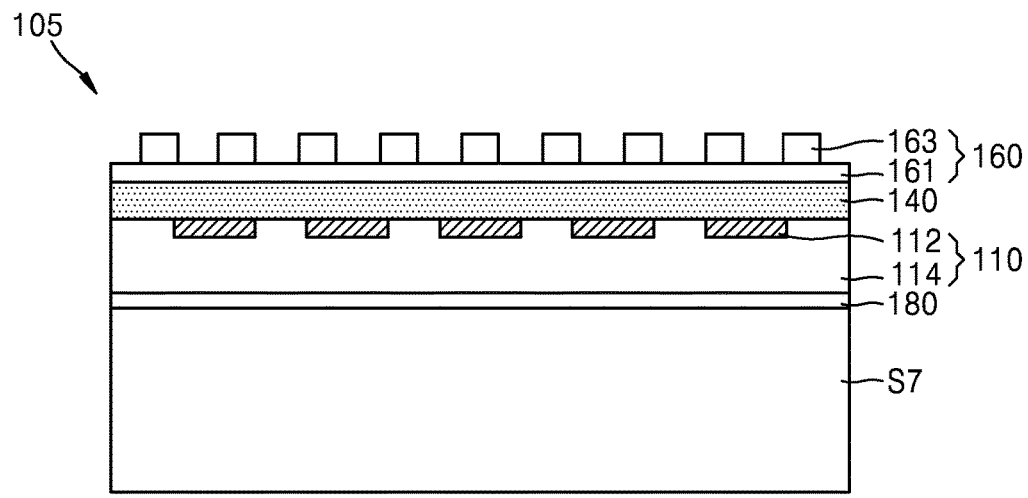

FIG. 7E illustrates a stack structure shown in FIG. 7D after turning the stack structure upside down. That is, the substrate S7 is located at a lowermost position, and a first silicon layer 165 is located at an uppermost position. A second material layer 164 is formed by decreasing the thickness of the first silicon layer 165 to an intended thickness (i.e., a predetermined thickness) as shown in FIG. 7F, and the second material layer 164 is patterned to form a plurality of nanostructures 163 as shown in FIG. 7G. In this manner, an image sensor 105 including a nanostructure color filter 160 is manufactured.

FIGS. 8A to 8G are views illustrating a method of manufacturing an image sensor 106 according to an exemplary embodiment.

The manufacturing method of the exemplary embodiment is different from the manufacturing method illustrated in FIGS. 6A to 6G, in that a substrate S8 used as a handling substrate is bonded to a protective layer 114 by a different method from the method illustrated in FIGS. 6A to 6G.

Figure 8A:
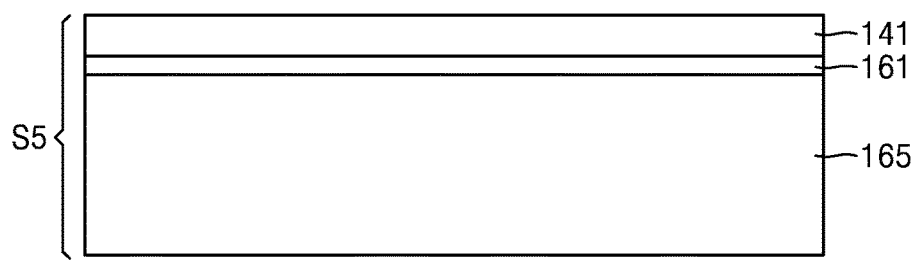
FIGS. 8A to 8G are views illustrating a method of manufacturing an image sensor according to an exemplary embodiment.
Figure 8B:
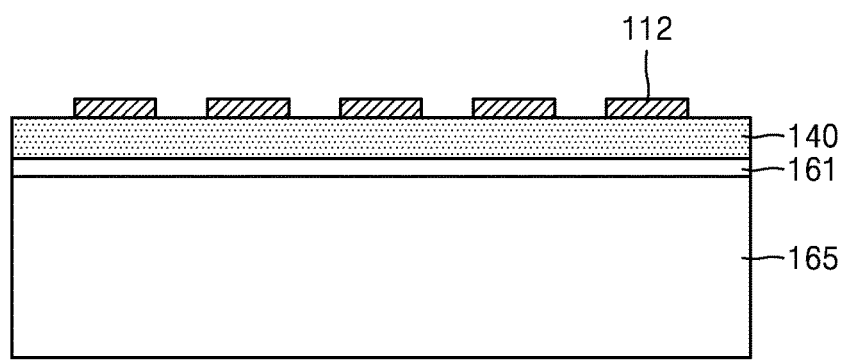
Figure 8C:
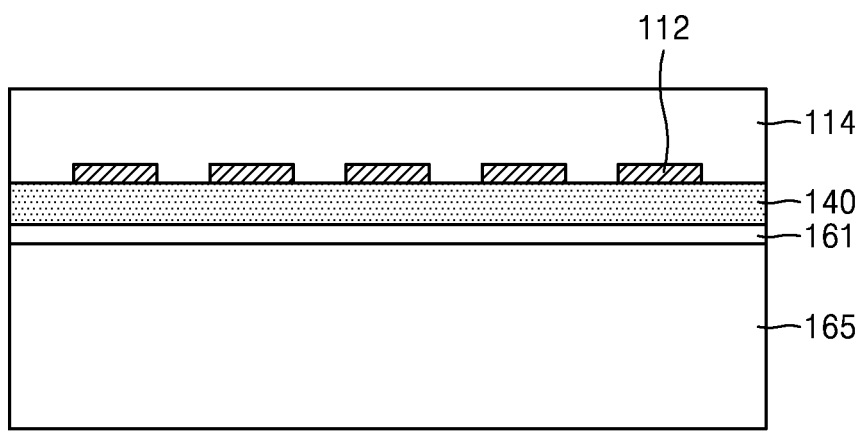
Figure 8D:
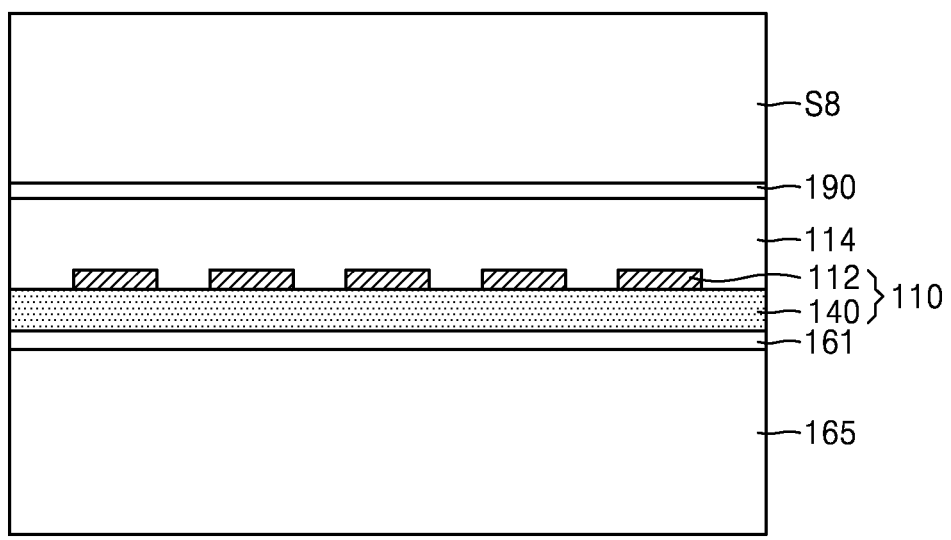

Processes illustrated in FIGS. 8A to 8C are substantially the same as those illustrated in FIGS. 6A to 6C. Referring to FIG. 8D, the substrate S8 is placed above the protective layer 114, and a metal layer 190 is further formed on the protective layer 114 to bond the substrate S8 and the protective layer 114 together by a metal bonding method using the metal layer 190 as a bonding material.

Figure 8E:
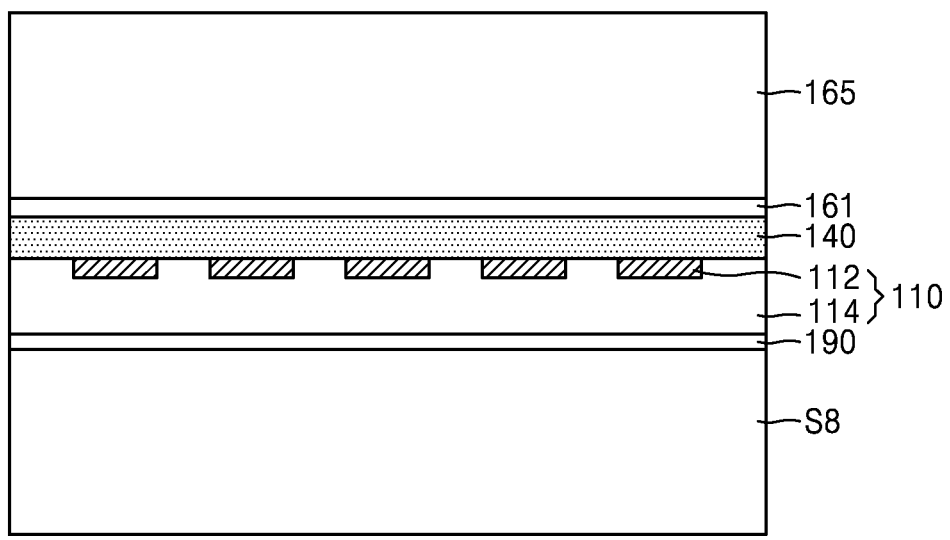
Figure 8F:
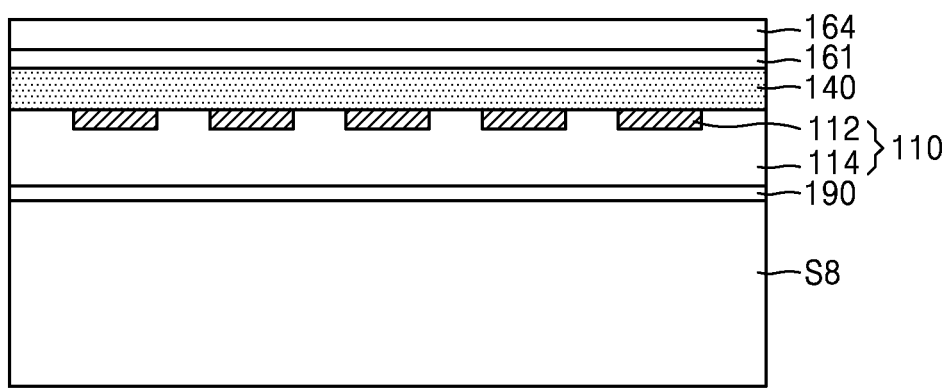
Figure 8G:
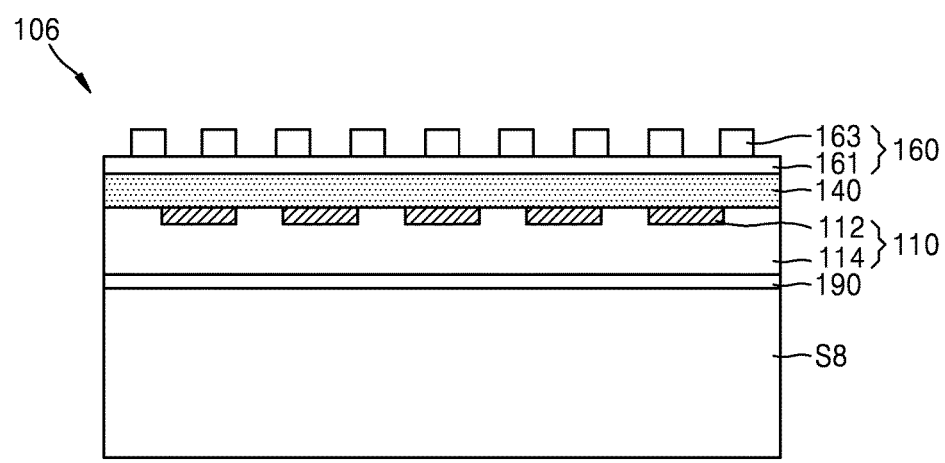

FIG. 8E illustrates a stack structure shown in FIG. 8D after turning the stack structure upside down. That is, the substrate S8 is located at a lowermost position, and a first silicon layer 165 is located at an uppermost position. A second material layer 164 is formed by decreasing the thickness of the first silicon layer 165 to an intended thickness (i.e., a predetermined thickness) as shown in FIG. 8F, and the second material layer 164 is patterned to form a plurality of nanostructures 163 as shown in FIG. 8G. In this manner, an image sensor 106 including a nanostructure color filter 160 is manufactured.

As described above, an image sensor including a nanostructure color filter may be manufactured by any one of the manufacturing methods of the exemplary embodiments described above.

According to any one of the manufacturing methods of the exemplary embodiments, optical characteristics are determined by factors such as the pitch, shape, or arrangement of nanostructures, and thus a nanostructure color filter having a high degree of wavelength selectivity and an easily adjustable color bandwidth may be manufactured to provide a thin high-resolution image sensor.

In addition, according to any one of the manufacturing methods of the exemplary embodiments, nanostructures having a thickness much smaller than the wavelength band of visible light and providing the function of microlenses may be designed to realize a thin image sensor not including microlenses.

In addition, according to the manufacturing methods of the exemplary embodiments, a silicon substrate or an SOI substrate is used to form nanostructures using a single crystal silicon layer of the substrate, and thus an image sensor having a high degree of wavelength selectivity may easily be manufactured.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While exemplary embodiments have been particularly shown and described above, it will be understood by those of ordinary skill in the art that various changes in form and details may be made therein without departing from the spirit and scope of the inventive concept as defined by the following claims.

What is claimed is:

1. A method of manufacturing an image sensor, the method comprising:
    preparing a sensor substrate comprising:
        a sensor layer comprising a photosensitive cell that receives light and generates electric signals; and
        a signal line layer comprising lines to receive the electric signals from the photosensitive cell;
    forming a first material layer having a first refractive index on the sensor substrate; and
    forming a nanopattern layer on the first material layer, the nanopattern layer comprising a material having a second refractive index greater than the first refractive index,
    wherein the sensor layer is disposed between the signal line layer and the first material layer.

2. The method of claim 1, wherein the forming the nanopattern layer comprises:
    bonding a first substrate having the second refractive index to the first material layer;
    forming a second material layer having a predetermined thickness by reducing a thickness of the first substrate; and
    patterning the second material layer to form a plurality of nanostructures on the first material layer.

3. The method of claim 2, wherein the patterning the second material layer comprises forming a plurality of regions in which at least one of a shape of the plurality of nanostructures and a pitch of adjacent nanostructures of the plurality of nanostructures is adjusted.

4. The method of claim 2, wherein the first material layer comprises a silicon oxide layer, and
    wherein the first substrate comprises a silicon substrate.

5. The method of claim 4, wherein the bonding the first substrate is performed by an anodic bonding method.

6. The method of claim 2, wherein the reducing the thickness of the first substrate comprises reducing the thickness of the first substrate by a chemical mechanical polishing (CMP) method.

7. The method of claim 2 further comprising forming a weak region in the first substrate by implanting ions into the first substrate prior to the bonding the first substrate.

8. The method of claim 7, wherein the thickness of the first substrate is reduced by a layer splitting method.

9. The method of claim 2, wherein the first substrate comprises a silicon-on-insulator (SOI) substrate, and wherein the SOI substrate comprises a first silicon layer, a second silicon layer and a silicon oxide layer provided between the first and the second silicon layers.

10. The method of claim 9, wherein the reducing thickness of the first substrate comprises removing the second silicon layer and the silicon oxide layer.

11. The method of claim 1, wherein the forming the nanopattern layer comprises:
    forming a plurality of nanostructures on a second substrate; and
    transferring the plurality of nanostructures on the second substrate to the first material layer.

12. The method of claim 11, further comprising forming a plurality of nanoribbons by underetching a surface of the second substrate, the underetched surface being in contact with the plurality of nanostructures.

13. The method of claim 12, wherein the plurality of nanostructures are transferred to the first material layer using a viscoelastic polymer.

14. The method of claim 2, wherein the bonding the first substrate is performed by a polymer bonding method.

15. A method of manufacturing an image sensor, the method comprising:
    preparing an SOI substrate comprising a first silicon layer, second silicon layer and a silicon oxide layer provided between the first and the second silicon layers;
    forming a sensor layer comprising at least one photosensitive cell by processing the second silicon layer;
    forming lines on the sensor layer to receive electric signals from the at least one photosensitive cell;
    forming a protective layer on the sensor layer to cover the lines;
    bonding a first substrate to the protective layer;
    reducing a thickness of the first silicon layer; and
    patterning the first silicon layer to form a nanopattern layer comprising a plurality of nano structures.

16. The method of claim 15, wherein the patterning the first silicon layer comprises forming a plurality of regions in which at least one of a shape of the plurality of nanostructures and a pitch of adjacent nanostructures of the plurality of nanostructures repeatedly arranged is adjusted.

17. The method of claim 15, wherein the protective layer comprises a silicon oxide.

18. The method of claim 17, wherein the first substrate comprises a silicon substrate.

19. The method of claim 18, wherein the bonding the first substrate to the protective layer is performed by an anodic bonding method.

20. The method of claim 15, wherein the bonding the first substrate to the protective layer is performed by a polymer bonding method using a polymer layer provided between the first substrate and the protective layer.

21. The method of claim 15, wherein the protective layer comprises a polymer, and
    wherein the bonding the first substrate to the protective layer is performed by a polymer bonding method.

22. The method of claim 15, wherein the bonding the first substrate to the protective layer is performed by a metal bonding method using a metal layer provided between the first substrate and the protective layer.

* * * * *